United States Patent
Tsujimoto et al.

(10) Patent No.: US 9,583,315 B2
(45) Date of Patent: Feb. 28, 2017

(54) PLASMA ETCHING APPARATUS AND PLASMA ETCHING METHOD

(71) Applicant: TOKYO ELECTRON LIMITED, Tokyo (JP)

(72) Inventors: Hiroshi Tsujimoto, Miyagi (JP); Tomoyuki Mizutani, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/784,210

(22) PCT Filed: May 7, 2014

(86) PCT No.: PCT/JP2014/062272
§ 371 (c)(1),
(2) Date: Oct. 13, 2015

(87) PCT Pub. No.: WO2014/185313
PCT Pub. Date: Nov. 20, 2014

(65) Prior Publication Data
US 2016/0056021 A1    Feb. 25, 2016

(30) Foreign Application Priority Data
May 15, 2013    (JP) .................................. 2013-103015

(51) Int. Cl.
*C23F 1/00*        (2006.01)
*H01J 37/32*       (2006.01)
(Continued)

(52) U.S. Cl.
CPC .... *H01J 37/32449* (2013.01); *H01J 37/3244* (2013.01); *H01J 37/32082* (2013.01);
(Continued)

(58) Field of Classification Search
CPC .......... H01J 2237/334; H01J 37/32082; H01J 37/32091; H01L 21/31116; H01L 21/3065; H01L 21/31114
(Continued)

(56) References Cited

U.S. PATENT DOCUMENTS

| 7,240,568 B2 * | 7/2007 | Atkinson | G01F 1/44 73/861.63 |
| 7,648,610 B2 * | 1/2010 | Komiya | C23C 16/4412 118/715 |
| 8,397,739 B2 * | 3/2013 | Gregor | F17D 3/00 137/101 |

FOREIGN PATENT DOCUMENTS

| JP | H05-55172 A | 3/1993 |
| JP | H07-22341 A | 1/1995 |

(Continued)

OTHER PUBLICATIONS

International Search Report issued on Aug. 12, 2014 for WO 2014/185313 A1.

*Primary Examiner* — Lan Vinh
(74) *Attorney, Agent, or Firm* — Rothwell, Figg, Ernst & Manbeck, P.C.

(57)    ABSTRACT

A plasma etching apparatus of the present disclosure etches a substrate by plasma of a processing gas. The plasma etching apparatus includes a processing container; a holding unit configured to hold a substrate; and an electrode plate. The plasma etching apparatus further includes configured to supply the processing gas to a space between the holding unit and the electrode plate and disposed in n (n is a natural number of two or more) regions of the substrate divided concentrically in a radial direction, respectively. In addition, the plasma etching apparatus further includes a high frequency power source configured to supply a high frequency power to at least one of the holding unit and the electrode
(Continued)

plate so as to generate plasma. The plasma etching apparatus controls a flow rate of the processing gas.

6 Claims, 6 Drawing Sheets

(51) Int. Cl.
*H01L 21/311* (2006.01)
*H01L 21/3065* (2006.01)
*H01L 21/67* (2006.01)

(52) U.S. Cl.
CPC .... *H01J 37/32091* (2013.01); *H01L 21/3065* (2013.01); *H01L 21/31116* (2013.01); *H01L 21/67069* (2013.01); *H01J 2237/334* (2013.01)

(58) Field of Classification Search
USPC ....... 438/706, 710, 712, 714, 717, 723, 736; 156/345.34, 345.35, 345.36, 345.39
See application file for complete search history.

(56) References Cited

FOREIGN PATENT DOCUMENTS

JP   2007-059306 A   3/2007
JP   4358727 B2      8/2009

* cited by examiner

PLASMA ETCHING APPARATUS AND PLASMA ETCHING METHOD

CROSS REFERENCE TO RELATED APPLICATIONS

This application is a national phase of PCT application No. PCT/JP2014/062272, filed on 7 May 2014, which claims priority from Japanese patent application No. 2013-103015, filed on 15 May 2013, all of which are incorporated herein by reference.

TECHNICAL FIELD

Various aspects and embodiments of the present disclosure relate to a plasma etching apparatus.

BACKGROUND

In a semiconductor device manufacturing process, as an apparatus for processing a substrate such as, for example, a semiconductor wafer (hereinafter, referred to as a "wafer"), there is a plasma etching apparatus in which etching is performed on the wafer by irradiating the wafer with plasma.

In plasma etching, a gas containing, for example, fluorine, chlorine, or oxygen is used as a processing gas to generate plasma. The plasma includes active species such as, for example, charged particles (hereinafter, referred to as "ions") and neutral particles (hereinafter, referred to as "radicals"). The surface of the wafer reacts with the plasma including ions and radicals to produce reaction products, and the produced reaction products are volatilized, so that etching is performed.

In the semiconductor device manufacturing process, wafers have recently been enlarged in diameter. With the enlargement in diameter of wafers, it is difficult to secure in-plane uniformity of a line width (critical dimension (CD)) and a depth of a hole or a bottom of a trench in a wafer plane during etching.

Meanwhile, there is also a technique for controlling a density distribution of radicals in a central region and a peripheral region in a wafer plane by adjusting an amount of a processing gas supplied from an upper electrode.

PRIOR ART DOCUMENT

Patent Document

Patent Document 1: Japanese Patent No. 4358727

SUMMARY OF THE INVENTION

Problems to be Solved

However, since the diffusion state of radicals is not uniform in the central region and the peripheral region in the wafer plane, the in-plane uniformity may not be secured.

Means to Solve the Problems

In an exemplary embodiment, a plasma etching apparatus disclosed herein etches a substrate by plasma of a processing gas. The plasma etching apparatus includes a processing container. The plasma etching apparatus further includes a holding unit provided within the processing container and configured to hold a substrate. The plasma etching apparatus further includes an electrode plate provided within the processing container to face the holding unit. The plasma etching apparatus further includes a plurality of supply units configured to supply the processing gas to a space between the holding unit and the electrode plate and disposed in n (n is a natural number of two or more) regions of the substrate divided concentrically in a radial direction, respectively. The plurality of supply units are configured to supply the processing gas to the n regions, respectively, from gas supplying holes which are equidistantly formed therein. The plasma etching apparatus further includes a high frequency power source configured to supply a high frequency power to at least one of the holding unit and the electrode plate so as to generate plasma from the processing gas supplied into the space by the plurality of supply units. The plasma etching apparatus includes a controller configured to control a flow rate of the processing gas supplied from the gas supplying holes in each of the regions based on the following equation:

$$Q'_1 = \frac{N_1 D_1}{\sum_{k=1}^{n} N_k D_k} Q \qquad (1)$$

$$\vdots$$

$$Q'_n = \frac{N_n D_n}{\sum_{k=1}^{n} N_k D_k} Q$$

Q: total flow rate of processing gas
$Q_1'$ to $Q_n'$: flow rate of processing gas in each of n divided regions
$D_1$ to $D_n$: concentration ratio of processing gas in each of n divided regions
$N_1$ to $N_n$: number of gas supplying holes in each of n divided regions.

Effect of the Invention

According to an aspect of a measurement method disclosed herein, a flow rate ratio may be easily selected for obtaining a desired etching characteristic.

DETAILED DESCRIPTION TO EXECUTE THE INVENTION

Figure 1:
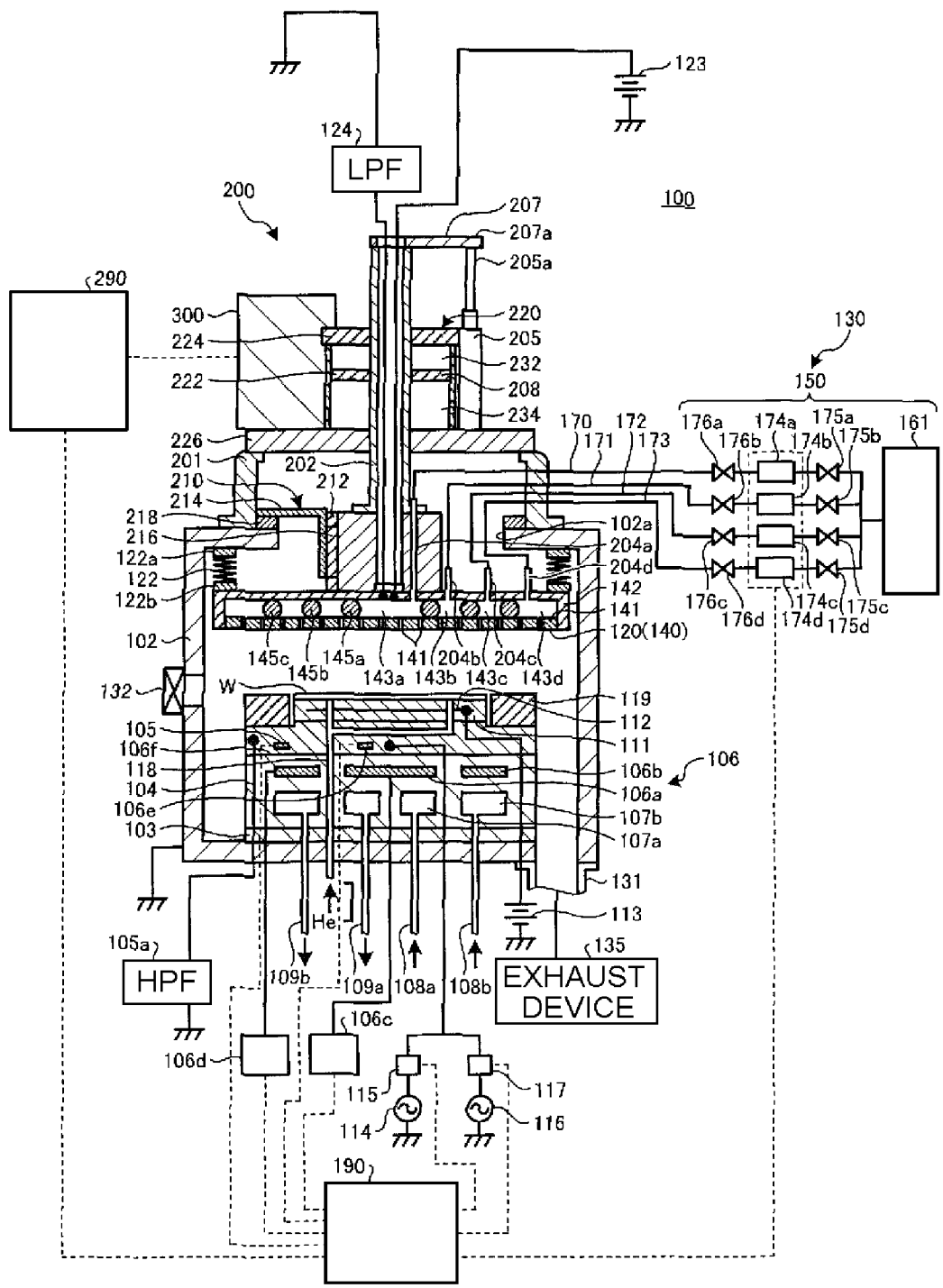
FIG. 1 is a schematic view illustrating an exemplary configuration of a plasma etching apparatus according to a first exemplary embodiment.

Hereinafter, a plasma etching apparatus and a plasma etching method disclosed herein will be described in detail with reference to the accompanying drawings. Meanwhile, the present disclosure is not limited by the exemplary embodiments. Respective exemplary embodiments may be properly combined with each other within a range that does not make the processing contents contradict.

First Exemplary Embodiment

A plasma etching apparatus for etching a substrate by plasma of a processing gas according to a first exemplary embodiment, includes a processing container in an example in the exemplary embodiment. The plasma etching apparatus further includes a holding unit provided within the processing container. The holding unit is configured to hold a substrate. The plasma etching apparatus further includes an electrode plate provided within the processing container to face the holding unit. The plasma etching apparatus further includes a plurality of supply units configured to supply a processing gas into a space interposed between the holding unit and the electrode plate and disposed in n (n is a natural number of two or more) regions of the substrate divided concentrically in a radial direction, respectively. The plurality of supply units are configured to supply the processing gas the n regions, respectively, from gas supplying holes which are equidistantly formed therein. The plasma etching apparatus further includes a high frequency power source configured to supply a high frequency power to at least one of the holding unit and the electrode plate so as to generate plasma from the processing gas supplied into the space by the plurality of supply units. The plasma etching apparatus includes a controller configured to control a flow rate of the processing gas supplied from the gas supplying holes in each of the regions based on the following equation:

$$Q'_1 = \frac{N_1 D_1}{\sum_{k=1}^{n} N_k D_k} Q \quad (1)$$

$$\vdots$$

$$Q'_n = \frac{N_n D_n}{\sum_{k=1}^{n} N_k D_k} Q$$

Q: total flow rate of processing gas
$Q_1'$ to $Q_n'$: flow rate of processing gas in each of n divided regions
$D_1$ to $D_n$: concentration ratio of processing gas in each of n divided regions
$N_1$ to $N_n$: number of gas supplying holes in each of n divided regions.

In addition, a plasma etching method for etching a substrate by plasma of a processing gas according to the first exemplary embodiment includes holding a substrate by a holding unit provided within a processing container. The plasma etching method further includes supplying a processing gas into a space interposed between the holding unit and an electrode plate facing the holding unit within the processing container a plurality of supply units which are disposed in n (n is a natural number of two or more) regions of the substrate divided concentrically in a radial direction, respectively. The plurality of supply units are configured to supply the processing gas the n regions, respectively, from gas supplying holes which are equidistantly formed therein. The plasma etching method further includes supplying a high frequency power to at least one of the holding unit and the electrode plate by a high frequency power source so as to generate plasma from the processing gas supplied into the space from the gas supplying holes formed in each of the regions. In the supplying of the processing gas, a flow rate of the processing gas supplied from the gas supplying holes in each of the regions is controlled based on the following equation:

$$Q'_1 = \frac{N_1 D_1}{\sum_{k=1}^{n} N_k D_k} Q \quad (1)$$

$$\vdots$$

$$Q'_n = \frac{N_n D_n}{\sum_{k=1}^{n} N_k D_k} Q$$

Q: total flow rate of processing gas
$Q_1'$ to $Q_n'$: flow rate of processing gas in each of n divided regions
$D_1$ to $D_n$: concentration ratio of processing gas in each of n divided regions
$N_1$ to $N_n$: number of gas supplying holes in each of n divided regions.

(Plasma Etching Apparatus According to First Exemplary Embodiment)

FIG. 1 illustrates an exemplary configuration of a plasma processing apparatus according to the first exemplary embodiment. The plasma processing apparatus 100 according to the first exemplary embodiment is, for example, a parallel flat plate type plasma etching apparatus.

The plasma etching apparatus 100 includes, for example, a cylindrical chamber (processing container) 102 made of aluminum, of which the surface is anodized (alumite-treated). The chamber 102 is grounded.

In the bottom portion within the chamber 12, a substantially cylindrical susceptor support 104 is provided via an insulating plate 103 such as, for example, a ceramic. Further, a susceptor 105 constituting a lower electrode is provided on the susceptor support 104. The susceptor 105 is connected with a high pass filter (HPF) 105a.

The susceptor 105 is formed in a disc shape in which the central portion of the upper side is convex, and provided thereon with an electrostatic chuck 111 having substantially the same shape as a wafer W which is an exemplary object to be processed. The electrostatic chuck 111 has a configuration in which an electrostatic electrode 112 is interposed between insulating materials. Further, the electrostatic chuck 111 is made of a disc-shaped ceramic member, and connected with a DC power source 113.

When a positive DC voltage is applied to the electrostatic electrode 112, a negative potential is generated on the electrostatic chuck 111 side surface of the wafer W (hereinafter, referred to as a "rear surface"). Accordingly, a potential difference is generated between the electrostatic electrode 112 and the rear surface of the wafer W. The wafer W is attracted and held to the electrostatic chuck 111 by a Coulomb force or a Johnson-Rahbeck force caused by the potential difference. At this time, a DC voltage of, for example, 1.5 kV is applied to the electrostatic chuck 111 from the DC power source 113 connected to the electrostatic electrode 112.

The susceptor 105 is connected with a first high frequency power source 114 and a second high frequency power source 116 via a first matcher 115 and a second matcher 117, respectively. The first high frequency power source 114 applies a bias power, which is a high frequency power having a relatively low frequency of, for example, 13.6 MHz, to the susceptor 105. The second high frequency power source 116 applies a plasma generating power, which is a high frequency power having a relatively high frequency of, for example, 40 MHz, to the susceptor 105. Therefore, the susceptor 105 applies the plasma generating power to the inside of the chamber 102.

In the insulating plate 103, the susceptor support 104, the susceptor 105, and the electrostatic chuck 111, a gas passage 118 is formed so as to supply a heat transfer medium (e.g., a backside gas such as, for example, He gas) to the rear surface of the wafer W. The heat transfer is carried out between the susceptor 105 and the wafer W through the heat transfer medium, so that the wafer W is maintained at a predetermined temperature.

An annular focus ring 119 is disposed on a peripheral portion of the upper end of the susceptor 105 to surround the wafer W supported on the electrostatic chuck 111. The focus ring 119 is made of a dielectric material such as, for example, ceramic or quartz, or a conductor, for example, a conductive material such as a monocrystalline silicon which is the same as the material constituting the wafer W.

When a plasma distribution area is expanded to the top of the focus ring 119, the density of the plasma at the outer peripheral side of the wafer W may be maintained at the same level as the density of the plasma at the central side of the wafer W. Therefore, the uniformity of the plasma etching in the wafer W plane may be enhanced.

An upper electrode 120 is provided above the susceptor 105 to face the susceptor 105 in parallel to the susceptor 105. The upper electrode 120 is connected with a DC power source 123. Further, the upper electrode 120 is connected with a low pass filter (LPF) 124.

Further, the upper electrode 120 is configured to be driven, for example, vertically by an upper electrode driving unit 200. When the upper electrode 120 is configured to be driven vertically, a distance (hereinafter, referred to as a "gap") G of the space between the upper electrode 120 and the susceptor 105 is capable of being adjusted. The gap G is a parameter that has a strong influence on diffusion and flow of the processing gas. Therefore, with the configuration capable of adjusting the gap G, the plasma distribution between the upper electrode 120 and the susceptor 105 inside the chamber 102 may be controlled, as described later.

A vertical movement amount of the upper electrode 120 driven by the upper electrode driving unit 200 is not particularly limited. As an example, the vertical movement amount of the upper electrode 120 may be set to 70 mm, and the gap G may be adjusted in a range of 20 mm or more and 90 mm or less. There is no restriction in this respect. Meanwhile, the plasma etching apparatus 100 may have a configuration obtained by rotating by 90° and laterally tilting the configuration illustrated in FIG. 1, or a configuration obtained by turning the configuration illustrated in FIG. 1 upside down.

The upper electrode 120 is supported to an upper inner wall of the chamber 102 through a bellows 122. The bellows 122 is attached to the upper inner wall of the chamber 102 by a fixing means such as, for example, a bolt, through an annular upper flange 122a, and at the same time, attached to an upper surface of the upper electrode 120 by a fixing means such as, for example, a bolt through an annular upper flange 122b.

The configuration of the upper electrode driving unit 200 for adjusting the gap G will be described in detail. The upper electrode driving unit 200 includes a substantially cylindrical support member 204 that supports the upper electrode 120. The support member 204 is attached to substantially the center of the upper portion of the upper electrode 120 by, for example, bolts.

The support member 204 is disposed to freely go into/out from a hole 102a formed substantially at the center of an upper wall of the chamber 102. Specifically, an outer peripheral surface of the support member 204 is supported in the inside of the hole 102a of the chamber 102 through a slide mechanism 210.

The slide mechanism 210 includes, for example, a guide member 216 and a rail 212. The guide member 216 is fixed to the upper portion of the chamber 102 through a vertical portion of a fixing member 214 having an L-shaped cross-section. The rail 212 is slidably supported by the guide member 216, and thus, formed in one direction (the vertical direction in the present exemplary embodiment) on the outer peripheral surface of the support member 204.

In the fixing member 214 that fixes the guide member 216 of the slide mechanism 210, the horizontal portion thereof is fixed to the upper portion of the chamber 102 through an annular horizontal adjustment plate 21. The horizontal position of the upper electrode 120 is adjusted by the horizontal adjustment plate 218.

The horizontal adjustment plate 218 is fixed to the chamber 102 by, for example, a plurality of bolts arranged equidistantly in the circumferential direction of the horizontal adjustment plate 218. Further, an inclination amount of the horizontal adjustment plate 218 with respect to the horizontal direction may be adjusted by a projection amount of the bolts. The horizontal adjustment plate 218 adjusts an inclination with respect to the horizontal direction, and the guide member 216 of the slide mechanism 210 adjusts an inclination with respect to the vertical direction, so that an inclination of the upper electrode 120 with respect to the horizontal direction may be adjusted. That is, the upper electrode 120 may be maintained constantly in the horizontal position.

A pneumatic cylinder 220 is attached to the upper side of the chamber 102 through a cylindrical body 201 so as to drive the upper electrode 120. That is, the lower end of the cylindrical body is air-tightly attached by, for example, bolts to cover the hole 102a of the chamber 102, and the upper end of the cylindrical body 201 is air-tightly attached to the lower end of the pneumatic cylinder 220.

The pneumatic cylinder 220 includes a rod 202 which is drivable in one direction. The lower end of the rod 202 is connected to substantially the center of the upper portion of the support member 204, for example, by bolts. As the rod 202 is driven, the upper electrode 120 is driven along the slide mechanism 210 by the support member 204. The rod 202 is formed in, for example, a cylindrical shape, so that the inner space of the rod 202 is in communication with a central hole formed substantially at the center of the support member 204, to be opened to the atmosphere through. Accordingly, a wire to be grounded via the upper electrode 1120 and the low pass filter (LPF) 124, and a feeder wire for applying a DC voltage from the DC power source 123 to the upper electrode 120 may be wired so as to be connected from the inner space of the rod 202 to the upper electrode 120 through the central hole of the support member 204.

Further, a position detecting unit such as, for example, a linear encoder 205, is provided on a side portion of the pneumatic cylinder 220 so as to detect a position of the upper electrode 120. Meanwhile, at the upper end of the rod 202, an upper end member 207, including an extending portion 207a that extends laterally from the rod 202, is provided. The extending portion 207a of the upper end member 207 comes into contact with a detecting portion 205a of the linear encoder 205. Since the upper end member 207 is linked with the movement of the upper electrode 120, the position of the upper electrode 120 may be detected by the linear encoder 205.

The pneumatic cylinder 220 includes a cylindrical cylinder body 222, an upper support plate 224, and a lower support plate 226. The cylindrical cylinder body 222 is held by the upper support plate 224 and the lower support plate 226. On the outer peripheral surface of the rod 202, an annular partitioning member 208 is provided to partition the inside of the pneumatic cylinder 220 into an upper space 232 and a lower space 234.

Compressed air is introduced into the upper space 232 of the pneumatic cylinder 220 from an upper port 236 of the upper support plate 224. In addition, compressed air is introduced into the lower space 234 from a lower port 238 of the lower support plate 226. The rod 202 may be driven and controlled in one direction (e.g., the vertical direction) by controlling the amount of the air introduced into the upper space 232 from the upper port 236 and the amount of the air introduced into the lower space 234 from the lower port 238. The amount of the air introduced into the pneumatic cylinder 220 is controlled by a pneumatic circuit 300 provided near the pneumatic cylinder 220.

Further, the upper electrode driving unit 200 includes a controller 290, and the controller 290 is connected to an apparatus controller 190. A control signal from the apparatus controller 190 is transmitted to the controller 290, and respective parts of the upper electrode driving unit 200 are driven and controlled by the controller 290.

Inside the susceptor support 104, a temperature distribution adjusting unit 106 is disposed to adjust a temperature distribution in the wafer W plane. The temperature distribution adjusting unit 106 includes heaters 106a, 106b, heater power sources 106c, 106d, thermometers 106e, 106f, and coolant paths 107a, 107b.

Inside the susceptor support 104, a central side heater 106a and an outer peripheral side heater 106b are provided from the central side toward the outer peripheral side. The central side heater 106a is connected to a central side heater power source 106c, and the outer peripheral side heater 106b is connected to an outer peripheral side heater power source 106d. The central side heater power source 106c and the outer peripheral side heater power source 106d are able to independently control powers input to the central side heater 106a and the outer peripheral side heater 106b, respectively. Therefore, a temperature distribution along the radial direction of the wafer W may be generated in the susceptor support 104 and the susceptor 105. That is, the temperature distribution along the radial direction of the wafer W may be controlled.

Further, inside the susceptor support 104, a central thermometer 106e and an outer peripheral thermometer 106f are provided from the central side toward the outer peripheral side. The central thermometer 106e and the outer peripheral thermometer 106f measure the central side temperature and the outer peripheral side temperature of the susceptor support 104, respectively. Thus, the central side temperature and the outer peripheral side temperature of the wafer W may be derived therefrom. The temperatures measured by the central thermometer 106e and the outer peripheral thermometer 106f are sent to the apparatus controller 190 to be described later. The apparatus controller 190 adjusts the outputs of the central side heater power source 106c and the outer peripheral power source 106d such that the temperatures of the wafer W derived from the measured temperatures become a target temperature.

Further, inside the susceptor support 104, a central side coolant path 107a and an outer peripheral side coolant path 107b may be provided from the central side toward outer peripheral side. In addition, for example, cooling waters or fluorocarbon-based coolants having different temperatures may be circulated in the coolant paths, respectively. When the coolants are circulated, a coolant is introduced into the central side coolant path 107a through a central side introduction pipe 108a and discharged from a central side discharge pipe 109a. Meanwhile, another coolant is introduced into the outer peripheral side coolant path 107b through an outer peripheral side introduction pipe 108b and discharged from an outer peripheral side discharge pipe 109b.

The temperature of the susceptor 105 is adjusted by heating with the heaters 106, 106b and cooling with the coolants. Therefore, the temperature of the wafer W is adjusted to a predetermined temperature by a heating amount by radiation from plasma or irradiation of ions contained in the plasma, and heat exchange with the susceptor 105. Further, the susceptor support 104 includes the central side heater 106a (and the central side coolant path 107a) and the outer peripheral side heater 106b (and the outer peripheral side coolant path 107b). Therefore, the temperature of the wafer W may be independently adjusted at the central side and the outer peripheral side.

Further, although not illustrated in FIG. 1, a heat insulating material or space may be provided as a heat insulating layer between the central side heater 106a and the outer peripheral side heater 106b, or between the central side coolant path 107a and the outer peripheral side coolant path 107b. When the heat insulating layer is provided, the interval between the central side heater 106a and the outer peripheral side heater 106b, or the interval between the central side coolant path 107a and the outer peripheral side coolant path 107b, is thermally isolated. That is, a larger temperature distribution may be generated between the central side and the outer peripheral side of the wafer W.

An exhaust pipe 131 is connected to the bottom of the chamber 102, and an exhaust device 135 is connected to the exhaust pipe 131. The exhaust device 135 is provided with a vacuum pump such as, for example, a turbo molecular pump, and adjusts the inside of the chamber 102 to a predetermined decompressed atmosphere (e.g., 0.67 Pa or less). Further, a gate valve 132 is provided on the sidewall of the chamber 102. When the gate valve 132 is opened, it is possible to carry the wafer W into the chamber 102 and carry the wafer W out from the chamber 102. Meanwhile, for example, a conveyance arm is used for conveying the wafer W.

Further, the plasma etching apparatus 100 includes a gas supply condition controller 130 in order to adjust supply conditions of the plasma gas supplied to the wafer W supported on the susceptor 105. The gas supply condition controller 130 includes a shower head 140, which is configured integrally with the upper electrode 120, and a gas supply device 150.

The shower head 140 ejects a predetermined processing gas (which may be a mixed gas) onto the wafer W supported on the susceptor 105. The shower head 140 is provided with a circular electrode plate 141 (upper electrode 120) that has a plurality of gas supply holes 141a, and an electrode support 142 that detachably supports the upper surface of the electrode plate 141. The electrode support 142 is formed in a disc shape having the same diameter as that of the electrode plate 141, and includes a circular buffer chamber 143 formed therein. The electrode plate 141 is formed with gas supply holes (hereinafter, referred to as "gas supply holes 141" in some cases) to supply a gas such as, for example, a processing gas, to the wafer W.

Figure 2:
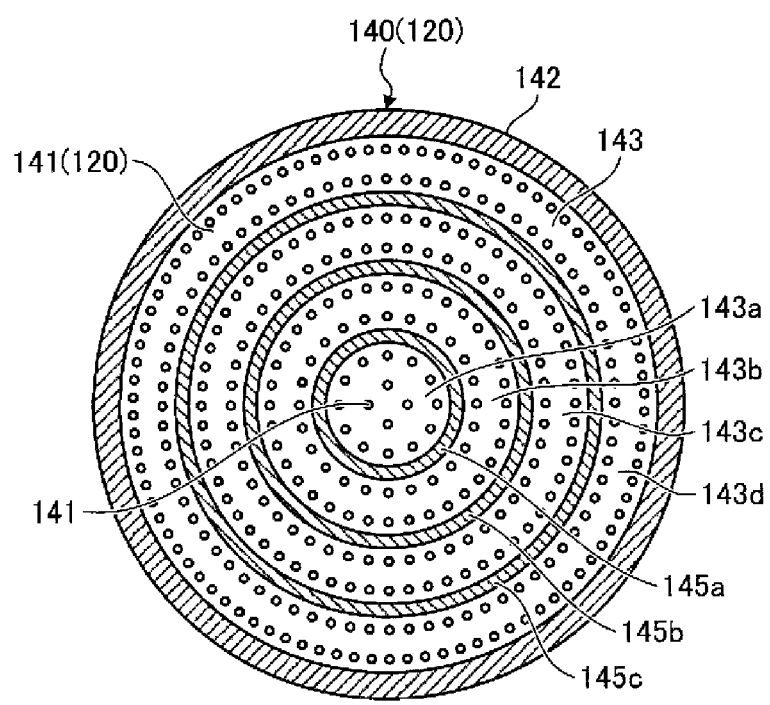
FIG. 2 is a schematic view illustrating an exemplary configuration of a shower head in the first exemplary embodiment.

FIG. 2 is a schematic view illustrating an exemplary configuration of the shower head in the first exemplary embodiment. As illustrated in FIG. 2, one or more annular partition wall members 145, each formed of an O-ring, are provided in the buffer chamber 143. The one or more annular partition wall members 145 are arranged at different positions with respect to the radial direction of the shower head. In FIG. 2, the annular partition wall members 145 are illustrated as a first annular partition wall member 145a, a second annular partition wall member 145b, and a third annular partition wall member 145c from the central side with respect to the radial direction of the shower head. Accordingly, the buffer chamber 143 is divided into a first buffer chamber 143a, a second buffer chamber 143b, a third buffer chamber 143c, and a fourth buffer chamber 143d. Thus, the buffer chamber 143 is divided into a plurality of regions.

The number of annular partition wall members 145 is not particularly limited as long as it is one or more. For example, the number of annular partition wall members 145 may be three as illustrated in FIG. 2, or two, or four or more. When the plasma etching is performed using a wafer W having a diameter of 300 mm, the number of the annular partition wall members 145 may be three (that is, including four divided buffer chambers) from the viewpoint of compatibility of ease of control of the processing gas with the in-plane uniformity of the etching by the plasma etching method to be described later. Meanwhile, when n annular partition wall members 145 are disposed, n+1 divided buffer chambers may be provided.

A predetermined processing gas is supplied to each of the buffer chambers 143a, 143b, 143c, 143d by the gas supply device 150.

Further, the lower surface of each of the buffer chambers 143a, 143b, 143c, 143d communicates with one or more gas supply holes 141, and a predetermined processing gas may be ejected onto the wafer W through the gas supply holes 141. As for the arrangement and the number of gas supply holes 141 to be arranged, an arrangement, which causes the processing gas to be uniformly ejected to the wafer W, is desirable.

Specifically, the gas supply holes 141 are formed equidistantly in each of the regions divided by the annular partition wall members 145. For example, the gas supply holes 141 are formed such that the number of gas supply holes 141 per area is constant.

The gas supply device 150 includes a gas source 161 that supplies a processing gas which is a mixture of one or more gases, and flow rate controllers (e.g., mass flow controllers; MFCs) 174a to 174d. Further, one pipe extending from the gas source 161 is branched and connected to the flow rate controllers 174a to 174d. Further, the branched pipes are provided with valves 175a to 175d, respectively, which close or open the pipes between the gas source 161 and the flow rate controllers 174a to 174d, respectively. Further, each of the flow rate controllers 174a to 174d is connected to any of four buffer chambers. Further, valves 176a to 176d are provided in the pipes connecting the flow rate controllers 174a to 174d and the four buffer chambers, respectively.

That is, the processing gas supplied from the gas source 161 is supplied to any of the four buffer chambers through any of pipes 171 to 174 after the flow rate is controlled by any of the flow rate controllers 174a to 174d. Thereafter, the processing gas supplied to the buffer chambers is ejected from the gas supply holes 141 formed in the buffer chambers.

Meanwhile, one of, for example, a fluorocarbon-based fluorine compound (CF-based), Ar gas, $N_2$ gas, and He gas, or a mixed gas of two or more of the fluorocarbon-based fluorine compound (CF-based), Ar gas, $N_2$ gas, and He gas, is supplied from the gas supply device 150. The fluorocarbon-based fluorine compound (CF-based) is, for example, $CF_4$, $C_4F_6$, $C_4F_8$, $CH_2F_2$, or $CHF_3$. However, the processing gas is not limited thereto, but any processing gas may be used.

Operations by the flow rate controllers 174a to 174d are controlled by, for example, the apparatus controller 190 (to be described later) of the plasma etching apparatus 100.

Here, the apparatus controller 190 of the plasma etching apparatus 100 includes an arithmetic processing unit (not illustrated) including, for example, a CPU, and a recording medium (not illustrated) including, for example, a hard disc. The apparatus controller 190 controls operations of respective parts of the first high frequency power source 114, the second high frequency power source 116, the temperature distribution adjusting unit 106, the upper electrode driving unit 200, and the gas supply condition adjusting unit 130, as described above. And, when the apparatus controller 190 operates the respective parts, for example, the CPU of the apparatus controller 190 controls the respective parts according to a program corresponding to each etching processing, which is recorded in, for example, the hard disc of the apparatus controller 190.

(Plasma Etching Method)

Descriptions will be made on an exemplary plasma etching method using the plasma etching apparatus 100.

When a gas is supplied from the gas supply holes to the space between the upper electrode 120 and the susceptor 105, the gas flows in an exhaust direction (a direction in which the exhaust device 135 is connected) while being diffused. Whether the concentration distribution of gas components (e.g., radicals) transported by "diffusion" and "flow" depends on the factor of "diffusion" or the factor of "flow" varies depending on, for example, the positions of the gas supply holes. The Peclet number Pe is known as a dimensionless number that qualitatively indicates which one of the factors of "diffusion" and "flow" and how much the concentration distribution depends on. The Peclet number is represented by Equation (2) below, using a gas flow rate u (m/s), a mutual diffusion coefficient DAB (m²/s) of gas species, and a representative length L (m).

$$Pe = uL/D_{AB} \quad (2)$$

When the Peclet number Pe is smaller than 1 as a boundary, "diffusion" is dominant in the transportation of the gas. When Pe is larger than 1 (or equal to 1), "flow" is dominant in the transportation of the gas.

Figure 3A:
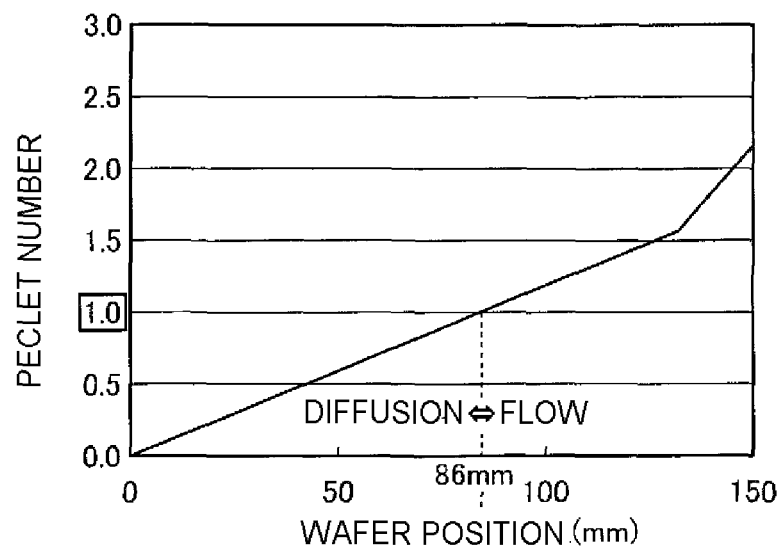
FIG. 3A is a schematic view illustrating a Peclet number at a position in a radial direction of a wafer in the present exemplary embodiment.

In order to make detailed descriptions based on a specific example, FIG. 3A illustrates the Peclet number at each position in the radial direction of the wafer in the present exemplary embodiment. FIG. 3A illustrates a case where a mixed gas of Ar and $C_4F_8$ (the mutual diffusion coefficient DAB is $1.23\times10^{-1}$ $m^2/s$) is used as the gas species. The representative length L (i.e., the gap G between the susceptor 105 and the upper electrode 120) was set to 0.03 m, and the gas flow rate u was obtained by a calculation so as to determine the Peclet number. Further, the horizontal axis of FIG. 3A represents a wafer position with respect to the radial direction, assuming that the center of the wafer having a diameter of 300 mm is 0 mm.

From FIG. 3A, it is found that a "diffusion"-dominant region and a "flow"-dominant region are distinguished by a boundary where the diameter from the center of the wafer is 86 mm.

Figure 3B:
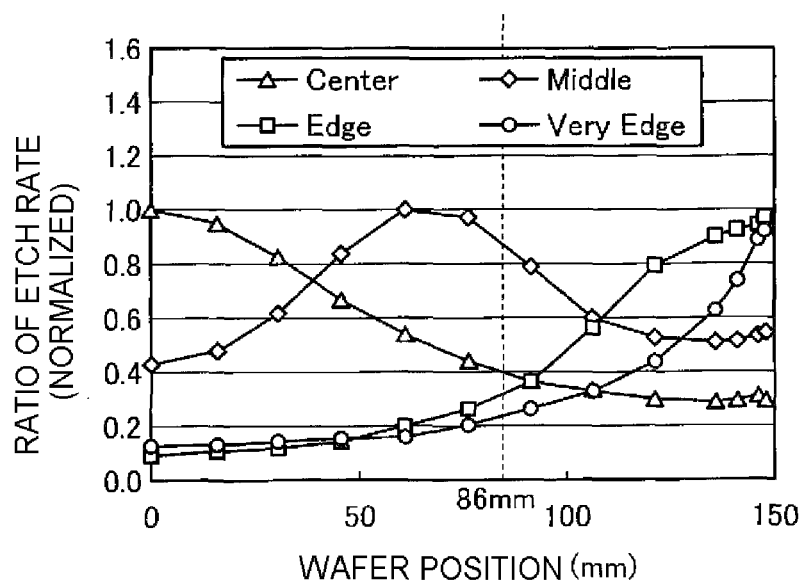
FIG. 3B is a schematic view illustrating a Peclet number at a position in a radial direction of a wafer in the present exemplary embodiment.

Further, FIG. 3B illustrates a etch rate ratio with respect to a wafer position when a wafer having a diameter of 300 mm is used. Specifically, a wafer W having a diameter of 300 mm was used, a buffer chamber was divided into four zones (including center, middle, edge, and very edge zones) by three annular partition wall members, and a plasma etching was performed by ejecting a gas from respective zones, thereby obtaining a etch rate ratio with respect to a wafer position. Meanwhile, as gas supply holes corresponding to the center zone, 4 gas supply holes were arranged on a circumference at 11 mm from the center of the shower head, and 12 gas supply holes were arranged on a circumference at 33 mm from the center of the shower head. In the middle zone, 24 gas supply holes were arranged on a circumference at 55 mm from the center of the shower head, and 36 gas supply holes were arranged on a circumference at 77 mm from the center of the shower head. In the edge zone, 48 gas supply holes were arranged on a circumference at 99 mm from the center of the shower head, and 60 gas supply holes were arranged on a circumference at 121 mm from the center of the shower head. In the very edge zone, 80 gas supply holes were arranged on a circumference at 143 mm from the center of the shower head, and 100 gas supply holes were arranged on circumference at 165 mm from the center of the shower head. Hereinafter, descriptions about the gas supply from the center, middle, edge, and very edge refer to the above-described arrangements of gas supply holes.

Further, the vertical axis of FIG. 3B indicates a ratio normalized by setting a position having the highest etch rate to 1.

From FIG. 3B, it is found that, when the gas is supplied in the center and middle zones, the etch rate increases at a position substantially corresponding to the position where the gas is supplied. This is because the transportation of the gas is "diffusion"-dominant in the center and middle zones (see FIG. 3A). Further, it is presumed that the gas supplied from the center and middle zones has an influence on the etch rates in the edge and very edge zones.

Meanwhile, when the gas is supplied from the edge (and very edge) zone, it is found that the etch rate influencing region is shifted to the outer peripheral side. This is presumably because the transportation of the gas was "flow"-dominant in the edge (and very edge) zone (see FIG. 3A), and the gas introduced from the edge zone flowed to the outer peripheral side. Further, the gas supplied from the edge and very edge zones has almost no influence on the etch rates in the center and middle zones.

That is, at a position where an influence of the diffusion of the supplied processing gas is dominant and a position where an influence of the flow rate of the supplied processing gas is dominant, it is important to perform a control by changing the supply conditions of the gas. Specifically, at the position where the influence of the diffusion of the supplied processing gas is dominant, the gas supply conditions of the gas supply holes corresponding to (approximately just above) the position are adjusted, and at the position where the influence of the flow rate of the supplied processing gas is dominant, the gas supply conditions of the gas supply holes located in the central direction from the position are adjusted, so that the in-plane uniformity may be enhanced at the time of the plasma etching. More specifically, when the influence of the diffusion of the processing gas supplied from the edge (and very edge) zone is dominant, the conditions of the processing gas from the edge (and very edge) zone are adjusted, and when the influence of the flow is dominant, the conditions of the processing gas from the center (and middle) zone at the central direction side of the wafer are adjusted, for example, by u, L, and DAB.

Subsequently, descriptions will be made on an influence of the supply conditions of the gas on the transportation of the gas. That is, descriptions will be made on which parameter of the supply gas influences enhancement of the in-plane uniformity in the in-plane shape of the wafer.

The diffusion of the supply gas depends on the mean free path l (m) of the diffused molecules (gas molecules) and the flow rate u (m/s) of the gas. In this case, assuming that the gas is an ideal gas and the speed of the diffused molecules follows Maxwell's distribution, the mean free path l of the diffused molecules are represented by Equation (3) below.

$$l=(T\times C_1)/(d^2\times P) \quad (3)$$

In equation (3), $C_1$ represents a constant, d represents a collision molecular diameter (m) of the diffused molecules, P represents a pressure (atm) in the system, and T is a temperature (K) in the system.

Meanwhile, assuming that the gas is an ideal gas, the flow rate u of the supply gas is represented by Equation (4) below.

$$u=(Q\times C_2)/PV \quad (4)$$

In Equation (4), $C_2$ represents a constant, Q represents a flow rate ($m^3/s$) at 1 atm, P represents a pressure in the system, and V is a volume ($m^3$) in the system.

In this case, since the diffusion area $d_{area}$ of the supply gas is proportional to the mean free path l/the flow rate u, Equation (5) is derived from Equation (3) and Equation (4).

$$d_{area} \propto l/u=(T\times V\times C_3)/(d^2\times Q) \quad (5)$$

In Formula (5), $C_3$ represents a constant.

That is, it is found that the diffusion area of the supply gas depends on the volume in the system, the flow rate of the supply gas, the temperature in the system, and the collision molecular diameter. Meanwhile, in the present exemplary embodiment, the volume in the system is approximated to the volume of the space between the upper electrode 120 and the susceptor 105, but the diameter of the object to be processed is not changed during the plasma etching. Thus, the volume in the system refers to the distance (gap G) of the space between the upper electrode 120 and the susceptor 105. Further, the flow rate of the supply gas is also correlated with the pressure in the system. Further, since the collision molecular diameter varies depending on the kind of the supply gas (i.e., the molecular weight of the supply gas), the diffusion area of the supply gas also depends on the molecular weight of the supply gas.

Referring to FIGS. 4A to 4D, descriptions will be made on a test that has confirmed that the diffusion area of the supply gas depends on parameters (supply conditions) such as, for example, the flow rate of the supply gas (and the pressure of the supply gas), the molecular weight of the supply gas, and the gap G.

FIGS. 4A to 4D are schematic views illustrating a change in etch rate when the supply conditions of the processing gas in the present exemplary embodiment were changed. As described above, the buffer chamber was divided into four zones (including center, middle, edge, and very edge zones) by three annular partition wall members, and the partial pressure of the gas supplied from each gas supply hole (see the etching conditions described below) was set to be constant. Further, an additional gas was supplied in an amount, which is indicated in the following etching conditions, from the gas supply holes on the outermost circumference in the very edge zone (on the circumference at 165 mm from the center of the shower head in the radial direction), and etch rates were plotted at each wafer position. Meanwhile, the vertical axes of FIGS. 4A to 4D represent an etch rate of silicon oxide, in a back end of line (BEOL) trench pattern, of the object to be processed in which the silicon oxide was deposited as a hard mask on a silicon wafer.

Figure 4A:
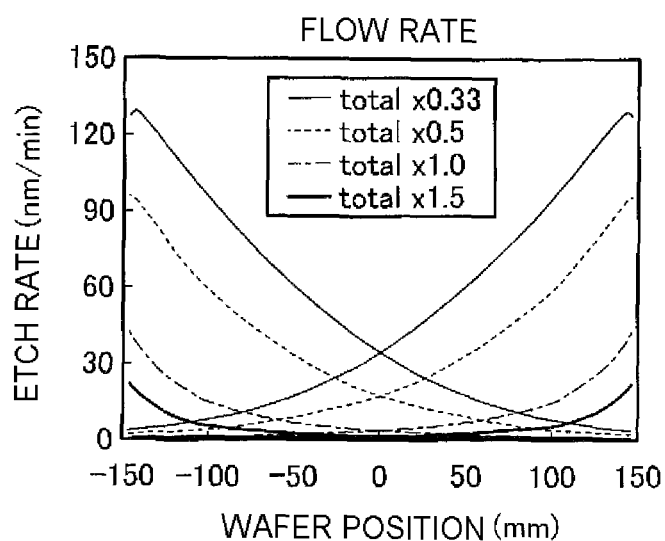
FIG. 4A is a schematic view illustrating a change in etch rate when a supply condition of a processing gas is changed.
Figure 4B:
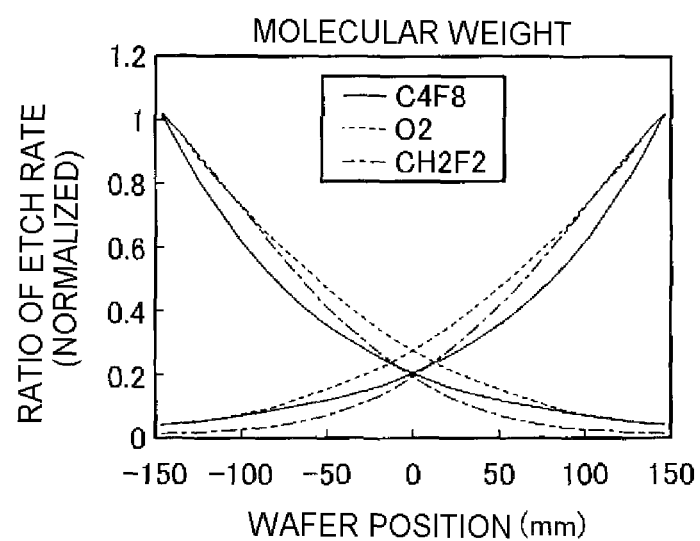
FIG. 4B is a schematic view illustrating a change in etch rate when a supply condition of a processing gas is changed.
Figure 4C:
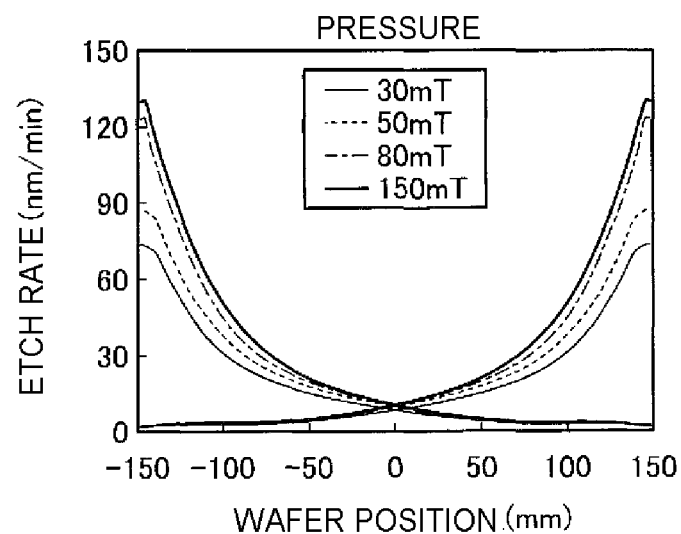
FIG. 4C is a schematic view illustrating a change in etch rate when a supply condition of a processing gas is changed.
Figure 4D:
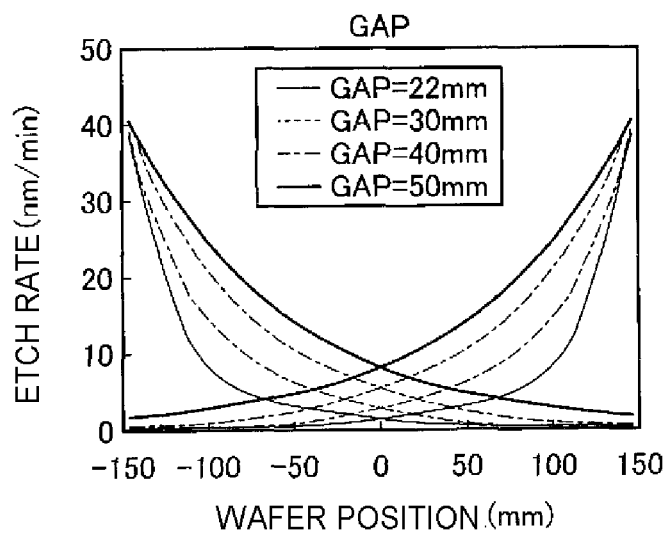
FIG. 4D is a schematic view illustrating a change in etch rate when a supply condition of a processing gas is changed.

The vertical axis of FIG. 4B represents an etch rate ratio normalized assuming that a position having the highest etch rate (the outermost circumference) is 1.

Detailed etching conditions are listed below.

Pressure within etching device: 80 mTorr (when changed: 30 to 150 mTorr)

Gap G: 30 mm (when changed: 22 mm to 50 mm)

Power of high frequency power source (40 MHz/13 MHz): 700/1000 W

Potential of upper electrode: 0 V

Flow rate of processing gas (in terms of total pressure): $C_4F_8/Ar/N_2/O_2$=30/1,200/70/17 sccm (however, in the outermost circumferential region, $C_4F_8$ ($O_2$ or $CH_2F_2$ when the molecular weight was changed) was added at 20 sccm, and when the flow rate was changed, the test was performed in a range of the flow rate×0.33 to ×1.5)

Processing time: 60 seconds

From the plots of the etch rates of FIGS. 4A to 4D, it is found how the respective parameters influence the diffusion of the supply gas. That is, it is found that, as the flow rate of the supply gas is decreased, the molecular weight of the supply gas is reduced, the pressure in the system is increased, and the gap G is widened, the diffusion of the supply gas is widened. That is, since the concentration distribution of the gas (i.e., radicals) is controlled by controlling these parameters, it is found that the in-plane uniformity may be enhanced with respect to the in-plane shape of the wafer during the plasma etching.

As described above, the radical distribution, that is, the gas concentration distribution is important for controlling the uniformity of the etching. The plasma etching apparatus supplies a gas in n (n is a natural number of two or more) divided regions, and the distribution ratio of the gas supplied to a reaction chamber from each region may be determined using a parameter having a high correlation with the gas concentration. In the plasma etching apparatus 100 according to the first exemplary embodiment, desired etching characteristics are obtained by controlling the flow rate of the gas supplied into the reaction chamber.

Specifically, the area ratio of each of the regions and the gas concentration are correlated with each other. When the gas supply holes 141 are formed equidistantly in the shower head, there is a correlation between the number of the gas supply holes 141 and the area of the regions. That is, when the area ratio of the divided region is determined, it is possible to replace it with the number of the gas supply holes 141 formed in the region. On this basis, the plasma etching apparatus 100 controls the flow rate of the gas supplied to the reaction chamber from each region, based on the number of the gas supply holes 141 in each region.

Specifically, the plasma etching apparatus 100 includes a controller that controls the flow rate of the gas supplied from the gas supply holes in each region, by Equation (1) below.

$$Q'_1 = \frac{N_1 D_1}{\sum_{k=1}^{n} N_k D_k} Q \qquad (1)$$

$$\vdots$$

$$Q'_n = \frac{N_n D_n}{\sum_{k=1}^{n} N_k D_k} Q$$

Q: total flow rate of processing gas $Q_1'$ to $Q_n'$: flow rate of processing gas in each of n divided regions $D_1$ to $D_n$: concentration ratio of processing gas in each of n divided regions $N_1$ to $N_n$: number of gas supplying holes in each of n divided regions.

For example, the controller of the plasma etching apparatus transmits the gas flow rate ratios of "$Q_1/Q$" ... "$Q_n/Q$" to the flow rate controllers 174 that correspond to the n regions, respectively, so that the flow rate of the processing gas supplied to the reaction chamber from each region is controlled.

Meanwhile, in a case where there are three regions, the controller of the plasma etching apparatus controls the flow rate of the gas supplied from the gas supply holes in each region after Equation (1) is changed to Equation (6) below.

$$Q'_1 = \frac{N_1 D_1}{N_1 D_1 + N_2 D_2 + N_3 D_3} Q \qquad (6)$$

$$Q'_2 = \frac{N_2 D_2}{N_1 D_1 + N_2 D_2 + N_3 D_3} Q$$

$$Q'_3 = \frac{N_3 D_3}{N_1 D_1 + N_2 D_2 + N_3 D_3} Q$$

Figure 5A:
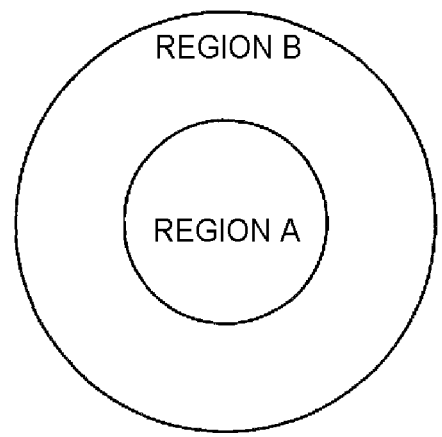
FIG. 5A is a view illustrating a relationship between an area ratio and a gas concentration ratio in the first exemplary embodiment.
Figure 5B:
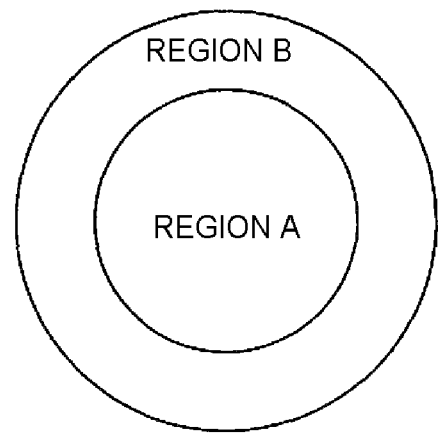
FIG. 5B is a view illustrating a relationship between an area ratio and a gas concentration ratio in the first exemplary embodiment.

FIGS. 5A and 5B are views illustrating a relationship between the area ratio and the gas concentration ratio in the first exemplary embodiment. For convenience of explanation, in the examples illustrated in FIGS. 5A and 5B, a case where region A and region B are present will be exemplified. Further, descriptions will be made on a case where the area ratio of region A and region B is "1:2" in the example illustrated in FIG. 5A, and the area ratio of region A and region B is "1:1" in the example illustrated in FIG. 5B.

Here, when the processing gas is supplied to the reaction chamber at the total flow rate of 300 sccm, the case where the gas concentration ratios are set to 1:1 in region A and region B will be described by way of example. In this case, since the gas concentration ratios D of region A and region B are equal, the gas flow rate ratio is determined by the number of gas supply holes. In the case illustrated in FIG. 5A, the flow rate in region A is "300 sccm×(⅓)=100 sccm", and the flow rate in region B is "300 sccm×(⅔)=200 sccm." By setting the gas flow rate ratio in this manner, the concentration ratios of the gas supplied from the gas supply holes in region A and region B become equal to each other. In addition, in the case illustrated in FIG. 5B, the flow rate in region A is "150 sccm", and the flow rate in region B is "150 sccm". Further, the case where the gas concentration rations are set to 2:1 in region A and region B will be described by way of example. Here, in the case illustrated in FIG. 5A, since the gas concentration ratio of region B is halved as compared with that of region A in Equation (1), the flow rate of region A is "150 sccm", and the flow rate of region B is "150 sccm." Further, in the case illustrated in FIG. 5B, the flow rate of region A is "200 sccm", and the flow rate of region B is "100 sccm."

Here, if the processing gas is simply supplied to each region at the same gas flow rate ratio, the concentration ratio of the processing gas is different between the regions. As a result, the relationship in etching rate is changed between the regions. In contrast, according to the first exemplary embodiment, the flow rate ratio of the processing gas is determined based on Equation (1) so as to obtain a predetermined concentration ratio of the processing gas, thereby determining the flow rate. Therefore, even though the setting (e.g., the area ratio) of the regions in the shower head is changed, the relationship of the etching rate in respective regions may be simply adjusted.

That is, according to the first exemplary embodiment, when the processing gas is distributed to a plurality of regions, desired etching characteristics may be obtained by controlling the gas flow rate ratio so that a desired gas concentration ratio is obtained in each region.

Although an exemplary embodiment of the present disclosure has been described, the present disclosure is not limited to such specific exemplary embodiments, but various modifications and variations may be made within the scope of the gist of the present disclosure described in the claims. For example, the exemplary embodiment has been described with respect to a case where the regions supplied with gas are divided concentrically, but may be similarly applied to a case of polygons such as, for example, squares without being limited to concentric circles. Further, the object to be processed which may be etched by the plasma etching apparatus of the present disclosure is not particularly limited. Specifically, for example, a wafer made of a silicon substrate, on which a silicon dioxide ($SiO_2$) film, a target etching film made of a polysilicon film, one or more mask layers, a bottom anti-reflective coating (BARC), and a photoresist film are formed, may be used. In this case, the resist film is pre-exposed and developed, so that a predetermined pattern is formed thereon.

DESCRIPTION OF SYMBOL

W: wafer
100: plasma etching apparatus
105: susceptor (support)
106: temperature distribution adjusting unit
120: upper electrode (electrode)
122: bellows
130: gas supply condition adjusting unit
140: shower head
141: gas supply hole
143: buffer chamber
145: annular partition wall member
150: gas supply device
174: flow rate controller
190: apparatus controller
200: upper electrode driving unit (interval adjusting unit)

What is claimed is:

1. A plasma etching apparatus for etching a substrate by plasma of a processing gas, the plasma etching apparatus comprising:
a processing container;
a substrate holding unit provided at a bottom portion of the processing container and configured to hold a substrate;
a gas shower head including a buffer chamber provided at an upper portion of the processing container to face the substrate holding unit, the buffer chamber being concentrically divided into n regions (where n is a natural number of two or more) in a radial direction and each of the n regions being provided with a plurality of gas supply units which are equidistantly formed therein in order to supply the processing gas to a space between the gas shower head and the substrate holding unit;
a high frequency power source configured to supply a high frequency power to at least one of the substrate holding unit and the gas shower head so as to generate plasma from the processing gas supplied into the space by the plurality of gas supply units; and
a controller configured to control a flow rate of the processing gas supplied from the plurality of gas supply units in each of the n regions based on the following equation:

$$Q'_1 = \frac{N_1 D_1}{\sum_{k=1}^{n} N_k D_k} Q \qquad (1)$$

$$\vdots$$

$$Q'_n = \frac{N_n D_n}{\sum_{k=1}^{n} N_k D_k} Q$$

Q: total flow rate of processing gas
$Q_1'$ to $Q_n'$: flow rate of processing gas in each of n divided regions
$D_1$ to $D_n$: concentration ratio of processing gas in each of n divided regions
$N_1$ to $N_n$: number of gas supply units in each of n divided regions.

2. A plasma etching method for etching a substrate by plasma of a processing gas, the method comprising:
holding a substrate by a substrate holding unit provided at a bottom portion of a processing container;
supplying a processing gas into a space interposed between the substrate holding unit and a shower head provided at an upper portion of the processing container facing the substrate holding unit, the shower head including a buffer chamber being concentrically divided into n regions (where n is a natural number of two or more) in a radial direction and each of the n regions being provided with a plurality of gas supply units which are equidistantly formed therein in order to supply the processing gas into the space interposed between the substrate holding unit and the shower head; and
supplying a high frequency power to at least one of the substrate holding unit and the gas shower head by a high frequency power source so as to generate plasma from the processing gas supplied into the space from the plurality of gas supply units formed in each of the n regions,
wherein, in the supplying of the processing gas, a flow rate of the processing gas supplied from the plurality of gas supply units in each of the n regions is controlled based on the following equation:

$$Q'_1 = \frac{N_1 D_1}{\sum_{k=1}^{n} N_k D_k} Q \qquad (1)$$

$$\vdots$$

$$Q'_n = \frac{N_n D_n}{\sum_{k=1}^{n} N_k D_k} Q$$

Q: total flow rate of processing gas $Q_1'$ to $Q_n'$: flow rate of processing gas in each of n divided regions $D_1$ to $D_n$: concentration ratio of processing gas in each of n divided regions $N_1$ to $N_n$: number of gas supply units in each of n divided regions.

3. A plasma etching apparatus for etching a substrate by plasma of a processing gas, the plasma etching apparatus comprising:

a processing container including a substrate holding unit provided at a bottom portion thereof and a shower head provided at an upper portion thereof;

a high frequency power source configured to supply a high frequency power to at least one of the substrate holding unit and the gas shower head so as to generate plasma within the processing container from the processing gas supplied from the gas supply unit into the processing container; and a controller configured to control a flow rate of the processing gas supplied from the gas shower head, wherein the gas shower head is concentrically divided into n regions (where n is a natural number of two or more) in a radial direction and each of the n regions is provided with a plurality of gas supply units which are equidistantly formed therein in order to supply the processing gas to a space between the gas shower head and the substrate holding unit within the processing container, and the controller is programmed to control a flow rate of the processing gas supplied from the plurality of gas supply units in each of the n regions to the processing container based on a concentration ratio of the processing gas and the number of gas supply units in each of the n regions.

4. The plasma etching apparatus of claim 3, wherein the gas shower head includes an electrode plate and an electrode support that forms the buffer chamber divided into n regions, and a plurality of gas supply holes is formed in each of the n regions of the electrode plate to form the plurality of gas supply units in each of the n regions of the gas shower head.

5. The plasma etching apparatus of claim 3, further comprising a focus ring provided on an upper end of the substrate holding unit and configured to surround the substrate when the substrate is disposed on the substrate holding unit, wherein the controller is programmed to control the flow rate of the processing gas in each of the n regions such that a plasma distribution is expanded to a top of the focus ring.

6. The plasma etching apparatus of claim 3, wherein each of the n regions of the gas shower head is connected to an independent gas supply source such that the flow rate of the processing gas in each of the n regions is controlled independently by the controller.

* * * * *